United States Patent
Umeda et al.

(10) Patent No.: US 9,219,459 B2
(45) Date of Patent: Dec. 22, 2015

(54) RECEIVING DEVICE AND REMOTE CONTROL SYSTEM

(75) Inventors: Toshiyuki Umeda, Inagi (JP); Shoji Otaka, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 139 days.

(21) Appl. No.: 13/614,110

(22) Filed: Sep. 13, 2012

(65) Prior Publication Data

US 2013/0249676 A1    Sep. 26, 2013

Related U.S. Application Data

(63) Continuation of application No. PCT/JP2010/002365, filed on Mar. 31, 2010.

(51) Int. Cl.
| | | |
|---|---|---|
| G08C 19/16 | (2006.01) | |
| H03G 3/30 | (2006.01) | |
| H04B 1/30 | (2006.01) | |

(52) U.S. Cl.
CPC .............. *H03G 3/3089* (2013.01); *H04B 1/30* (2013.01)

(58) Field of Classification Search
CPC ................................ H03G 3/3089; H04B 1/30
See application file for complete search history.

(56) References Cited

U.S. PATENT DOCUMENTS

| | | | | |
|---|---|---|---|---|
| 4,247,947 A | * | 1/1981 | Miyamoto | ................... 340/7.22 |
| 2005/0282505 A1 | | 12/2005 | Umeda et al. | |
| 2006/0128345 A1 | | 6/2006 | Ootaka et al. | |
| 2006/0197668 A1 | * | 9/2006 | Oliver | ................ G06K 19/0701 340/572.4 |
| 2007/0236258 A1 | * | 10/2007 | Kiziloglu et al. | ................ 327/55 |
| 2008/0080214 A1 | * | 4/2008 | Umeda et al. | .................. 363/37 |
| 2008/0158926 A1 | | 7/2008 | Umeda et al. | |
| 2008/0311850 A1 | | 12/2008 | Ootaka et al. | |
| 2008/0318523 A1 | | 12/2008 | Umeda et al. | |
| 2009/0184690 A1 | * | 7/2009 | Otaka et al. | .................. 320/166 |
| 2009/0302935 A1 | | 12/2009 | Iwata et al. | |
| 2010/0223147 A1 | * | 9/2010 | Oishi | .............................. 705/23 |

FOREIGN PATENT DOCUMENTS

| | | |
|---|---|---|
| CN | 1722595 | 1/2006 |
| EP | 1607900 | 12/2005 |
| EP | 1852804 | 11/2007 |
| JP | 10-049643 | 2/1998 |
| JP | 2006-034085 | 2/2006 |

(Continued)

OTHER PUBLICATIONS

International Search Report issued on Jun. 15, 2010 for PCT/JP2010/002365 filed on Mar. 31, 2010 with English Translation.

(Continued)

*Primary Examiner* — Ojiako Nwugo
(74) *Attorney, Agent, or Firm* — Oblon, McClelland, Maier & Neustadt, L.L.P.

(57) ABSTRACT

A receiving device includes a rectifier configured to rectify a received signal and a bias supply unit configured to intermittently supply the rectifier with a bias voltage corresponding to a threshold voltage of the rectifier. The receiving device further includes a detector configured to detect the received signal based on an output of the rectifier and a controller configured to control the bias supply unit to stop supplying the bias voltage upon detection of the received signal by the detector.

7 Claims, 4 Drawing Sheets

(56) References Cited

FOREIGN PATENT DOCUMENTS

| | | |
|---|---|---|
| JP | 2006-166415 | 6/2006 |
| JP | 2009-302652 | 12/2009 |

OTHER PUBLICATIONS

International Written Opinion issued on Jun. 15, 2010 for PCT/JP2010/002365 filed on Mar. 31, 2010.

* cited by examiner

RECEIVING DEVICE AND REMOTE CONTROL SYSTEM

CROSS-REFERENCE TO RELATED APPLICATION

This application is a continuation application of prior International Application No. PCT/JP2010/002365 filed on Mar. 31, 2010; the entire contents of all of which are incorporated herein by reference.

FIELD

Embodiments described herein relate generally to a receiving device receiving a radio signal, and more specifically relates to a receiving device rectifying and decoding a radio signal.

BACKGROUND

In a receiving device receiving a radio signal and processing the signal, a rectifier is widely used for signal detection. When the rectifier (rectifying circuit) is used for signal detection, it is possible to easily achieve radio communication of low power consumption. An example of the receiving device using the rectifier is what is called an RFID tag. The RFID tag rectifies a transmitted signal from a reader/writer to obtain operating power of the RFID tag itself and demodulates a received signal.

Such an RFID tag normally has a rectifying circuit using a transistor in which a gate and a source are connected. However, the rectifying circuit using the transistor is not able to receive a weak signal due to a threshold voltage which the transistor has. Accordingly, there has been proposed a sensitive rectifier which intermittently applies between the gate and the source of a transistor constituting the rectifying circuit a bias voltage substantially equal to the threshold voltage of the transistor. The proposed rectifier is able to reduce the influence of the threshold voltage of the transistor. Thus, when this rectifier is applied to a receiving device, it is possible to receive a weak signal.

However, the proposed rectifying circuit gives the bias voltage to the transistor by intermittently operating a switch, and hence generates switching noise. That is, there has been a problem that the receiving device including this rectifier is affected by the switching noise.

DETAILED DESCRIPTION

As described above, in the conventional receiving device, there has been a problem that it is affected by noise generated by the rectifying circuit itself. The embodiments have been made to solve such a problem, and an object thereof is to provide a receiving device in which the influence of noise is suppressed.

To achieve the above-described object, a receiving device according to one aspect of the embodiments includes a rectifier which rectifies a received signal and a bias supply unit which intermittently supplies the rectifier with a bias voltage corresponding to a threshold voltage of the rectifier. The receiving device further includes a detector which detects the received signal based on an output of the rectifier and a controller which controls the bias supply unit to stop supplying the bias voltage when the detector detects the received signal.

(First Embodiment)

Figure 1:
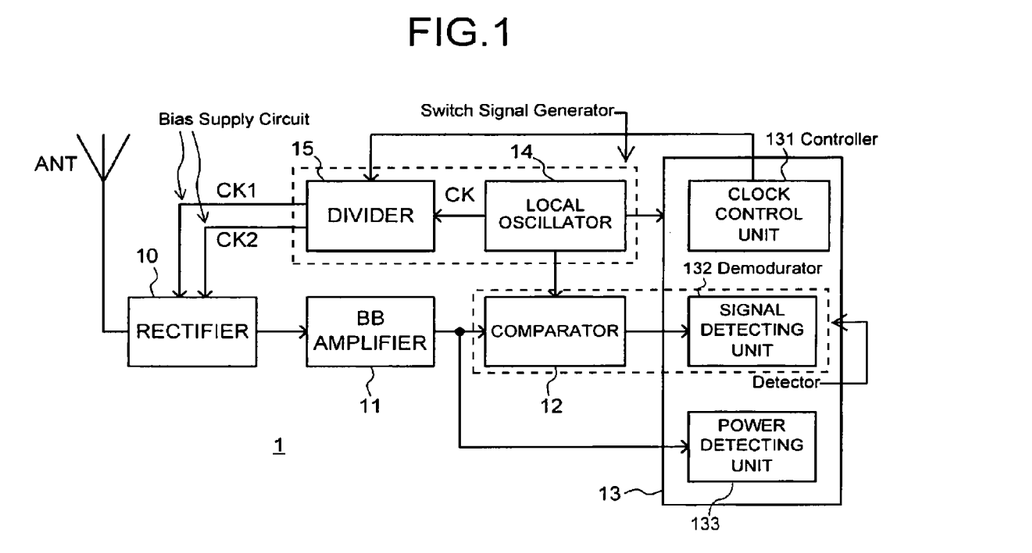
FIG. 1 is a block diagram illustrating a structure of a receiving device according to an embodiment.

Hereinafter, one aspect of the embodiments will be described in detail with reference to the drawings. As illustrated in FIG. 1, a receiving device 1 of this embodiment has an antenna ANT, a rectifier 10, a baseband (BB) amplifier 11, a comparator 12, a signal processing unit 13, a local oscillator 14, and a divider 15. Further, the signal processing unit 13 has a clock control unit 131, a signal detecting unit 132, and a power detecting unit 133.

The rectifier 10 rectifies (detects) a received signal inputted from an antenna ANT. The rectifier 10 has, for example, semiconductor elements such as a rectifying diode and a rectifying transistor, and uses the semiconductor elements to envelope detect the received signal and output a baseband signal. The BB amplifier 11 is an amplifier which amplifies the baseband signal obtained by rectifying by the rectifier 10 to a predetermined level. As will be described later, the rectifier 10 has a function to increase detection sensitivity of the received signal by using clock signals CK1 and CK2 from the outside. Note that the rectifier 10 is not limited to ones rectifying with semiconductor elements. Besides semiconductor elements, ones having rectifying elements with a rectification function may be used.

As shown in FIG. 1, the comparator 12 and the signal detecting unit serve as a detector. The comparator 12 generates a digital signal from the baseband signal amplified by the BB amplifier 11. Specifically, the comparator 12 compares the level of the baseband signal amplified by the BB amplifier 11 with the level of a predetermined reference voltage source. As a result of comparison, when the level of the baseband signal is larger than the reference voltage level, the comparator 12 outputs a high-level signal. On the other hand, when the level of the baseband signal is equal to or smaller than the reference voltage level, the comparator 12 outputs a low-level signal. As a result, the comparator 12 outputs a digital signal combining the high-level signal and the low-level signal. The digital signal formed of the high-level signal and the low-level signal may be a signal of any voltage and specifications as long as the signal processing unit 13 can identify the both signals in this signal.

The signal detecting unit 132 acts as a demodulator and receives and decodes the digital signal generated by the comparator 12, and performs, for example, comparison of ID of the received signal, or the like. The signal detecting unit 132 executes predetermined signal processing, such as activating a not-illustrated external circuit, when the ID of the received signal matches a predetermined ID.

As shown in FIG. 1, the local oscillator 14 and the divider 15 serve as a switch signal generator. The local oscillator 14 generates a reference signal of this receiving device. As the reference signal, besides the reference signal regulating processing timing of the comparator 12 or the signal processing unit 13 for example, a switch signal (clock signal) for increasing sensitivity of the rectifier 10 is also generated. The divider 15 divides a clock signal CK generated by the local oscillator 14. At this time, the divider 15 operates based on an instruction from the clock control unit 131, which will be described later.

The power detecting unit 133 detects power of the received signal based on an amplified output of the BB amplifier 11. That is, the power detecting unit 133 monitors an amplified output of the BB amplifier 11 and detects presence or absence of the received signal. The clock control unit 131 serves as a controller and controls supply of the clock signals CK1 and CK2 given to the rectifier 10 by controlling the divider 15 based on a result of power detection of the power detecting unit 133.

(Structure of the Rectifier)

Figure 2:
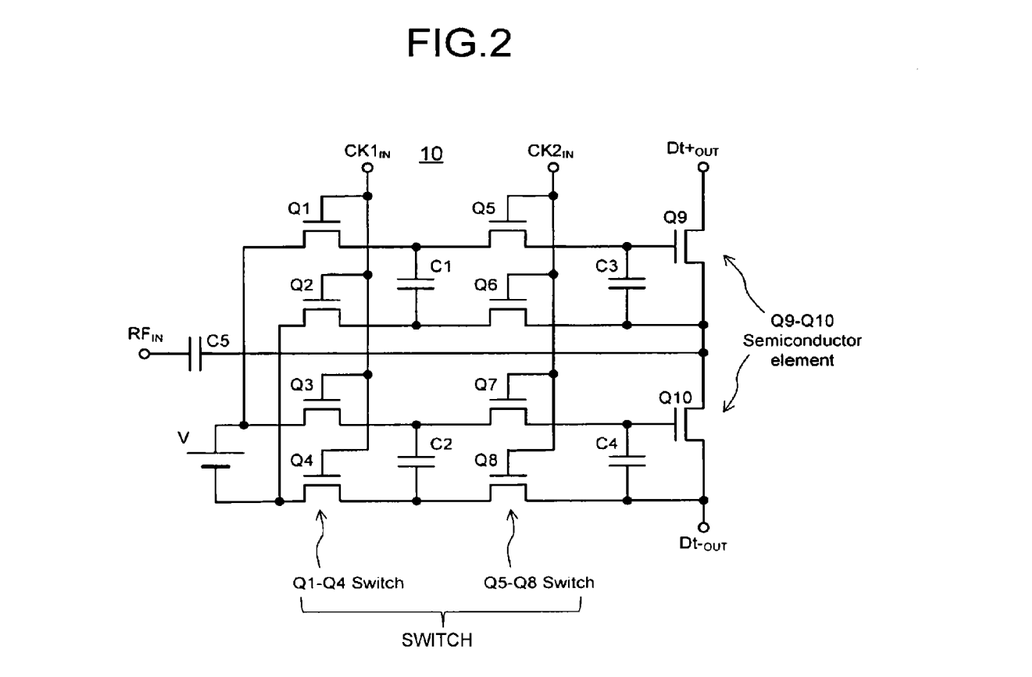
FIG. 2 is a circuit diagram illustrating a circuit example of a rectifier of the receiving device illustrated in FIG. 1.

A circuit example of the rectifier 10 will be described with reference to FIG. 2. As illustrated in FIG. 2, the rectifier 10 of this embodiment has a voltage source V, switch transistors Q1 to Q4 which are controlled to turn on or off by the clock signal CK1 as a switch signal, switch transistors Q5 to Q8 which are likewise controlled to turn on or off by the clock signal CK2 as a switch signal, and rectifying transistors Q9 and Q10.

A positive terminal and a negative terminal of the voltage source V are connected to both ends of a capacitor C1 via drains and sources of the transistors Q1 and Q2, respectively. That is, by turning on or off the transistors Q1 and Q2 by the clock signal CK1 given to gates of the transistors Q1 and Q2, the voltage source V is connected to/disconnected from the both ends of the capacitor C1. Similarly, the positive terminal and the negative terminal of the voltage source V are connected to both ends of a capacitor C2 via drains and sources of the transistors Q3 and Q4, respectively. That is, by turning on or off the transistors Q3 and Q4 by the clock signal CK1 given to gates of the transistors Q3 and Q4, the voltage source V is connected to/disconnected from the both ends of the capacitor C2.

The both ends of the capacitor C1 are connected to both ends of the capacitor C3 via drains and sources of the transistors Q5 and Q6, and the both ends of the capacitor C3 are connected respectively to a gate and a source of the transistor Q9. Similarly to the transistors Q1 and Q2, by turning on or off the transistors Q5 and Q6 by the clock signal CK2, connection between the both ends of the capacitor C3 and the both ends of the capacitor C1 are turned on or off. Similarly, the both ends of the capacitor C2 are connected to both ends of the capacitor C4 via drains and sources of the transistors Q7 and Q8, and the both ends of the capacitor C4 are connected respectively to a gate and a source of the transistor Q10. Similarly to the transistors Q5 and Q6, by turning on or off the transistors Q7 and Q8 by the clock signal CK2, connection between the both ends of the capacitor C4 and the both ends of the capacitor C2 are turned on or off.

The source of the transistor Q9 and a drain of the transistor Q10 are connected to each other, and to the connecting point thereof, the antenna ANT is connected via the capacitor C5 and a received signal input terminal $RF_{IN}$. That is, the received signal from the antenna ANT is inputted to the connecting point of the transistors Q9 and Q10. A drain of the transistor Q9 and the source of the transistor Q10 are positive and negative rectifying output terminals $Dt+_{OUT}/Dt-_{OUT}$, respectively. The negative rectifying terminal $Dt-_{OUT}$ may be grounded.

In FIG. 2, the clock signals CK1 and CK2 are configured to be supplied alternately. That is, the transistors Q1 to Q4 and the transistors Q5 to Q8 are turned on alternately. The voltage of the voltage source V is set to substantially the same as a threshold voltage which is the limit of rectification by the rectifying transistors Q9 and Q10. By the transistors Q1 to Q4 and the transistors Q5 to Q8 being turned on alternately by control of the clock signals CK1 and CK2, the potential of the voltage source V is transferred to the capacitors C1 and C2, and then the potentials of the capacitors C1 and C2 are transferred to the capacitors C3 and C4, respectively.

The capacitors C3 and C4 operate to supply a bias voltage as the threshold voltage to the transistors Q9 and Q10, respectively. This operation contributes to apparent reduction in threshold voltage of the transistors Q9 and Q10 (in other words, increasing sensitivity of rectification) while reducing power consumption by the voltage source supplying the bias voltage.

Note that in the example of the rectifier illustrated in FIG. 2, supply of potential of the voltage source V which is prepared in advance is controlled by the clock signals CK1 and CK2 as a switch signal, but it is not limited so. It may be configured such that one of the clock signals CK1 and CK2 as a signal having voltage corresponding to the threshold voltage value of the transistors Q9 and Q10 is supplied as it is as the bias voltage to the rectifying transistors of the rectifier 10.

Operation of the First Embodiment

Next, operation of the receiving device of this embodiment will be described.

The local oscillator 14 generates a predetermined clock signal CK. In the example illustrated in FIG. 3, the local oscillator 14 generates a clock signal CK of 32 KHz for example as an internal clock. The local oscillator 14 supplies the generated clock signal CK to the comparator 12, the signal processing unit 13, the divider 15, and so on.

The divider 15 divides the clock signal CK to generate clock signals CK1 and CK2 which become ON alternately, and supplies them to the rectifier 10. In the example illustrated in FIG. 3, the divider 15 divides the clock signal CK by 16 to generate clock signals CK1 and CK2 of 2 kHz, and supplies them to terminals $CK1_{IN}$ and $CK2_{IN}$ of the rectifier 10. At this time, the divider 15 sends to the clock control unit 131 timings of the clock signals CK1 and CK2 to rise, and the clock control unit 131 stores the sent timings.

The switch signal generator formed by the local oscillator 14 and the divider 15 of FIG. 1 and the connections from the divider 15 to the rectifier 10 as shown in FIG. 1 serve as a bias supply circuit. By the clock signals CK1 and CK2 given to the rectifier 10, the transistors Q1 to Q4 and the transistors Q5 to Q8 repeat to be in an ON state and an OFF state alternately. The potential of the voltage source V is transferred to the capacitors C3 and C4 by turning on or off of the transistors Q1 to Q4 and the transistors Q5 to Q8, thereby becoming a bias voltage of the transistors Q9 and Q10. That is, the transistors Q9 and Q10 become a sensitive state every time the bias voltage is transferred to the capacitors C3 and C4.

The transistors Q9 and Q10 rectify a received signal received via the capacitor C5, and sends an obtained baseband signal to the BB amplifier 11. The BB amplifier 11 amplifies the received baseband signal and sends the signal to the comparator 12 and the power detecting unit 133.

The comparator 12 compares the level of the amplified baseband signal with the level of a predetermined reference voltage source, and generates a digital signal combining a high-level signal and a low-level signal based on the comparison result. The generated digital signal is sent to the signal detecting unit 132.

The signal detecting unit 132 receives and decodes the digital signal generated by the comparator 12, and performs comparison of ID of the received signal for example. When the ID of the received signal matches a predetermined ID, the signal detecting unit 132 executes predetermined signal processing such as activating a not-illustrated external circuit.

On the other hand, the power detecting unit 133 monitors the baseband signal received from the BB amplifier 11. When the baseband signal exists, that is, the baseband signal is outputted from the BB amplifier 11, the power detecting unit 133 generates a detection signal and gives the signal to the clock control unit 131.

The clock control unit 131 monitors operation of the signal detecting unit 132 and the power detecting unit 133. That is, the clock control unit 131 determines whether the rectifier is in a signal waiting state or a signal receiving state at a timing which is several clocks prior to rising of the clock signals CK1 and CK2 (dashed arrows in FIG. 3).

When neither of the signal detecting unit 132 and the power detecting unit 133 is in operation, that is, when there is no input of received signal, the clock control unit 131 controls the divider 15 to generate (maintain) the clock signals CK1 and CK2. That is, by operation of the clock signals CK1 and CK2, supply of the bias voltage corresponding to the threshold voltage of the rectifying transistors of the rectifier 10 is continued, and the sensitive state of the rectifier is maintained. Then, by making the rectifier 10 be in the sensitive state, the receiving device 1 can be ready for arrival of a weak received signal. Note that the output signal of the rectifier 10 at a time when the clock signals CK1 and CK2 are supplied is affected by switching noise, and thus the signal detecting unit 132 may ignore a digital signal (combination of high/low-level signals) received via the comparator 12 without decoding it.

When one of the signal detecting unit 132 and the power detecting unit 133 is in operation, that is, when the signal detecting unit 132 has received the digital signal formed of high/low-level signals from the comparator 12, or when the power detecting unit 133 has received the amplified output from the BB amplifier 11 and the detection signal is generated, the clock control unit 131 controls the divider 15 to stop generation of the clock signals CK1 and CK2. Further, when the signal detecting unit 132 is in a state of not decoding the received signal, the clock control unit 131 instructs the signal detecting unit 132 to return to the receiving state.

When generation of the clock signals CK1 and CK2 stops, supply of the bias voltage in the rectifier 10 stops, and the rectifier 10 is maintained to be in the sensitive state for a while by the bias voltage retained in the capacitors C3 and C4. On the other hand, by stop of supply of the clock signals CK1 and CK2 to the rectifier 10, occurrence of switching noise in the rectifier 10 due to the clock signal ceases. Then, noise mixing in the received signal decreases, and the signal detecting unit 132 is able to decode without errors.

Note that the transition of the clock control unit 131 or the signal detecting unit 132 from the signal receiving state to the waiting state can be made by detecting end data of the received signal which is determined in advance, or the like by the signal detecting unit 132 after a prescribed format is detected, after a prescribed time passes, after an error is detected, or the like.

Thus, in the receiving device of this embodiment, when a received signal arrives, the clock signal which increases the sensitivity of the rectifier is stopped, and thus the clock noise which affects decoding processing can be reduced. That is, by a simple method, sensitive increase and noise reduction can be achieved while suppressing power consumption of the receiving device.

(Noise of the Rectifier)

Here, noise caused by the clock signals CK1 and CK2 supplied to the rectifier 10 will be described specifically.

The rectifier 10 detects a weak received signal as described above. When a weak signal is received, if the switch transistors Q1 to Q8 included in the rectifier 10 operate, for example, the control terminal $CK2_{IN}$ of the transistors Q5 to Q8 changes from low level to high level, a transient voltage variation occurs in the bias voltage to the rectifier transistors Q9 and Q10 due to a gate-source capacitance which the transistors Q5 to Q8 have, or the like.

This voltage variation becomes switching noise and is outputted to the output terminal $Dt+_{OUT}$ (and $Dt-_{OUT}$) together with a rectified signal. In this state, detection of the weak signal by the comparator 12 is difficult, which causes erroneous detection. Accordingly, in the receiving device of this embodiment, when an input state of received signal is confirmed, operation of the divider 15 is stopped to stop generation of the clock signals CK1 and CK2. That is, the noise source which hinders demodulation of the received signal is stopped. On the other hand, when there is no received signal and it is in a received signal waiting state, rectification sensitivity in the rectifier 10 is given priority, and the device changes to a sensitive state in which bias voltage supply with the clock signals CK1 and CK2 is performed.

Figure 4:
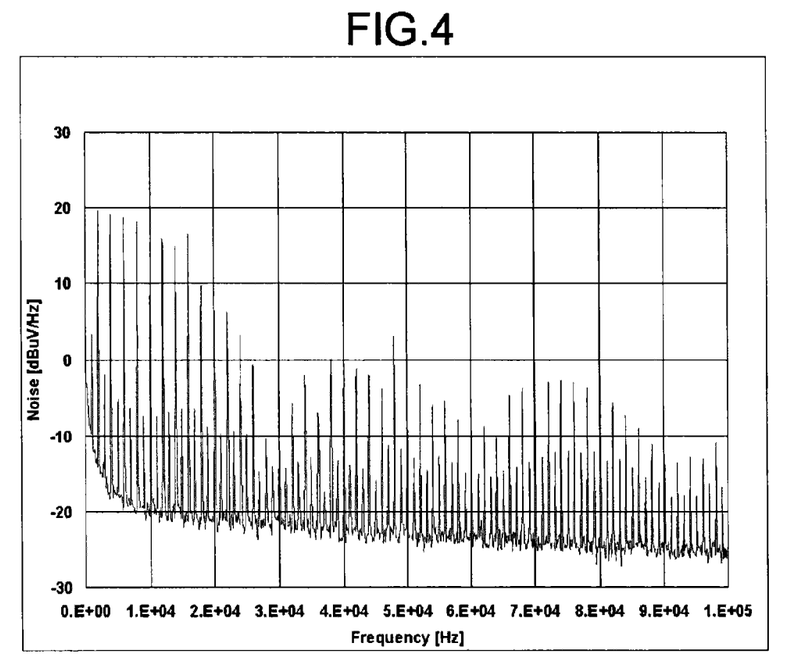
FIG. 4 is a spectrum diagram illustrating noise characteristics during switch operation of the rectifier.

FIG. 4 illustrates results of measuring output noise of the rectifier 10 in a state that the switches (switches by the transistors Q1 to Q8) of the rectifier 10 are in operation when no signal is inputted. As illustrated in FIG. 4, based on 2 kHz of the switching frequency, output noise of frequencies as multiples thereof are observed in a wide range of 0 kHz to 100 kHz.

When the frequency of the received signal is in this frequency range, the switching noise interferes with the received signal, and reception characteristics deteriorate.

Figure 5:
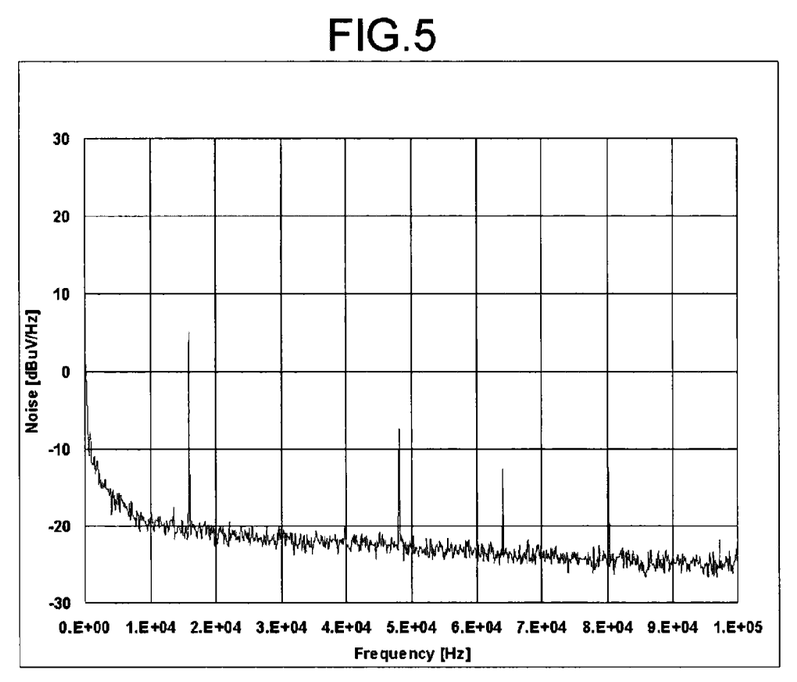
FIG. 5 is a spectrum diagram illustrating noise characteristics when switch operation of the rectifier is stopped.

FIG. 5 illustrates results of measuring output noise of the rectifier 10 in a state that the switches of the rectifier 10 are stopped when no signal is inputted. As illustrated in FIG. 5, although noise of 16 kHz as a basic clock and harmonics thereof is observed, other switching noise is suppressed, and noise characteristics of the rectifier transistors Q9 and Q10 themselves are observed.

As can be seen from these observation results, by using the receiving device of this embodiment, the influence of switch noise in the signal receiving state is eliminated, and hence the signal-to-noise ratio of the rectifier improves and reception sensitivity can be improved.

(Clock Signal Supplied to the Rectifier)

Figure 3:
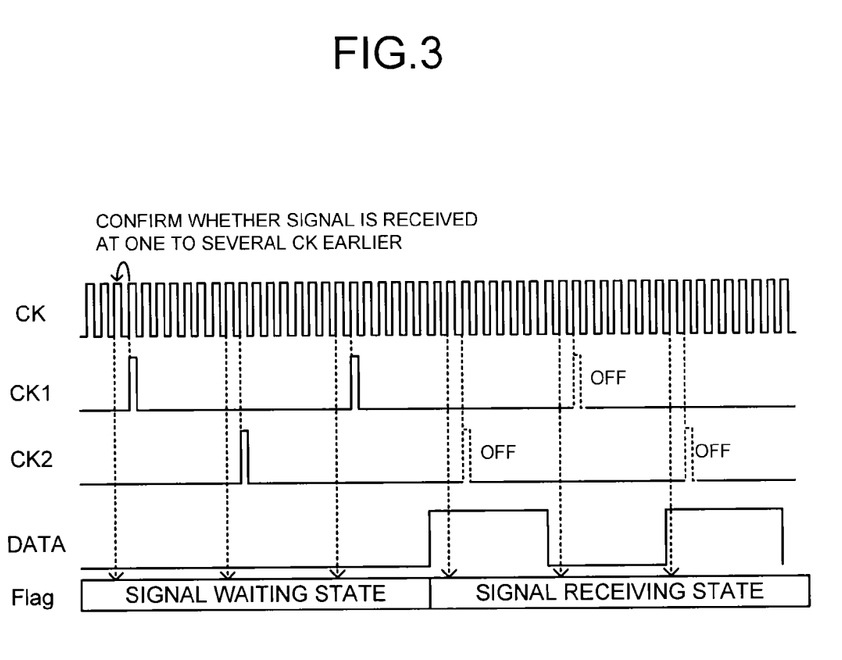
FIG. 3 is a diagram illustrating an operation timing of the rectifier illustrated in FIG. 2.

In the example illustrated in FIG. 1 to FIG. 3, the local oscillator 14 generates the clock signal CK of 32 kHz frequency, the divider 15 divides the clock signal CK by 16 to generate the clock signals CK1 and CK2 of 2 kHz. The higher the frequency of the clock signals CK1 and CK2 given to the rectifier 10, the longer the period of the sensitive state of the rectifier 10, and thus the more the rectification sensitivity of the rectifier can be increased. At the same time, the high clock signals CK1 and CK2 increase the switching noise in the rectifier. Accordingly, the clock signals CK1 and CK2 become more effective as they become lower. On the other hand, when frequencies of the clock signals CK1 and CK2 are too low, the period to increase the sensitivity of the rectifier 10 becomes short, and thus timings to capture a weak signal decrease.

In the receiving device of this embodiment, since supply of the bias voltage to the rectifier 10 is performed using the charged capacitors, the bias voltage can be maintained for a relatively long time in the signal waiting state in which there is no rectification output. For example, by making the cycle of the clock signals CK1 and CK2 (time period of intermittent operation of the switch transistors Q1 to Q4 and the transistors Q5 to Q8) sufficiently longer than a transmission time period of one packet of a packet signal included in the received signal, the switching noise can be suppressed low.

The dividing ratio of the divider 15 may be determined by comparing and weighing the frequency of the clock signal CK as a reference with the timing of bias voltage application in the rectifier 10.

(Second Embodiment)

Subsequently, a receiving device according to another embodiment will be described.

Figure 6:
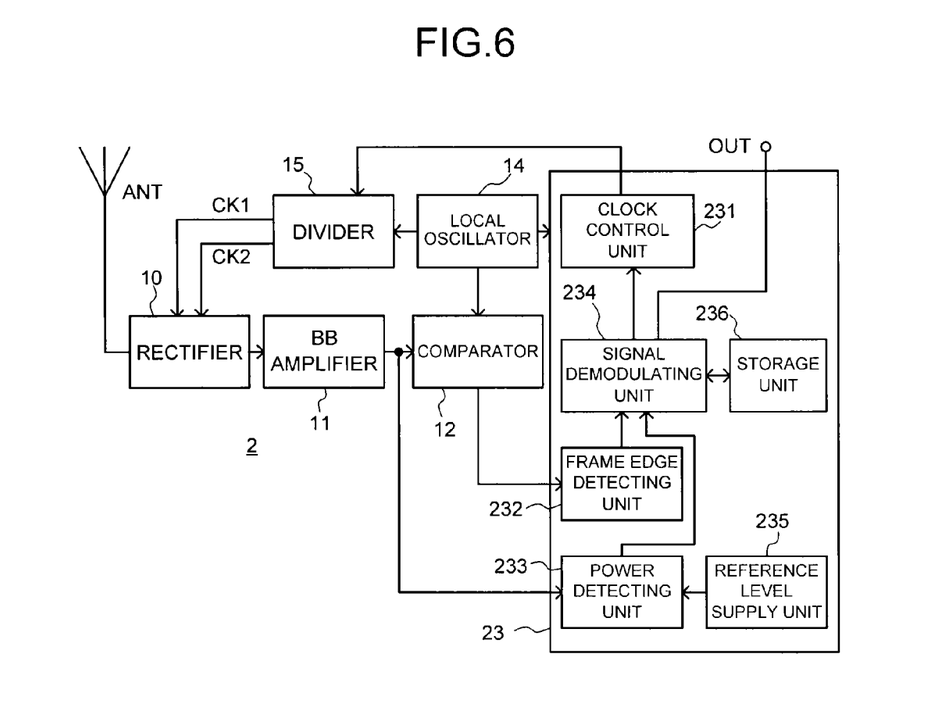
FIG. 6 is a block diagram illustrating a structure of a receiving device according to another embodiment.

FIG. 6 illustrates a receiving device in which, among the components of the receiving device 1 according to the embodiment illustrated in FIG. 1, the structure of the signal processing unit 13 is changed. Accordingly, components common to those of the receiving device of the embodiment illustrated in FIG. 1 are denoted by common reference numerals, and duplicating descriptions are omitted.

As illustrated in FIG. 6, a signal processing unit 23 of this embodiment has a clock control unit 231, a signal demodulating unit 234, a storage unit 236, a frame edge detecting unit 232, a power detecting unit 233, and a reference level supply unit 235. The clock control unit 231 and the power detecting unit 233 have functional structures common to the clock control unit 131 and the power detecting unit 133 illustrated in FIG. 1.

The frame edge detecting unit 232 corresponds to the signal detecting unit 132 illustrated in FIG. 1, and detects an edge of a signal from the digital signal generated by the comparator 12. The frame edge detecting unit 232 sends the detection result to the signal demodulating unit 234.

The storage unit 236 is a memory capable of storing data, similarly to a non-volatile memory for example, and an ID of a communication partner is stored therein in advance. The signal demodulating unit 234 decodes the digital signal based on the edge of the signal detected by the frame edge detecting unit 232, and compares it with the ID of the communication partner stored in the storage unit 236. When an ID obtained from the decoded digital signal matches the ID in the storage unit 236, the signal demodulating unit 234 outputs this ID and a control signal accompanying the ID to an output terminal OUT. At the same time, the signal demodulating unit 234 has a function to instruct the clock control unit 231 to stop the clock signals CK1 and CK2.

The reference level supply unit 235 is a memory capable of storing a predetermined signal level (voltage level) as an analog value or a digital value, similarly to a non-volatile memory for example. The reference level supply unit 235 gives the power detecting unit 233 a reference level for the power detecting unit 233 to determine presence or absence of a received signal.

Next, operation of the receiving device according to the embodiment illustrated in FIG. 6 will be described. In the receiving device illustrated in FIG. 6, the operation is common to the receiving device illustrated in FIG. 1 in a period from when the rectifier 10 rectifies the received signal from the antenna ANT to when the comparator 12 outputs the comparison signal. Accordingly, duplicating descriptions are omitted in the following description.

The comparator 12 compares the level of an amplified baseband signal with the level of a predetermined reference voltage source, and generates a digital signal combining a high-level signal and a low-level signal based on the comparison result. The generated digital signal is sent to the frame edge detecting unit 232.

The frame edge detecting unit 232 receives the digital signal generated by the comparator 12 and detects an edge of the signal, and sends the detection result to the signal demodulating unit 234.

The signal demodulating unit 234 decodes the digital signal based on the detection result of the frame edge detecting unit 232, and compares it with the ID of the communication partner stored in the storage unit 236. When an ID obtained from the decoded digital signal matches the ID stored in the storage unit 236, the signal demodulating unit 234 outputs this ID and a control signal accompanying the ID to the output terminal OUT, and instructs the clock control unit 231 to stop supply of the clock signals CK1 and CK2.

When a stop instruction is received, the clock control unit 231 controls the divider 15 to stop supply of the clock signals CK1 and CK2.

When the ID obtained from the decoded digital signal does not match the ID stored in the storage unit 236, the signal demodulating unit 234 instructs the clock control unit 231 to supply the clock signals CK1 and CK2.

When a supply instruction is received, the clock control unit 231 controls the divider 15 to supply the clock signals CK1 and CK2.

On the other hand, the power detecting unit 233 monitors the baseband signal received from the BB amplifier 11. When the signal is received from the BB amplifier 11, the power detecting unit 233 compares the level of the signal from the BB amplifier 11 with the reference level given from the reference level supply unit 235.

When the level of the signal from the BB amplifier 11 is higher than the reference level given from the reference level supply unit 235, the power detecting unit 233 determines that the baseband signal exists, and sends a trigger signal to the signal demodulating unit 234.

When the trigger signal is received, the clock control unit 231 controls the divider 15 to stop supply of the clock signals CK1 and CK2.

Further, when the level of the signal from the BB amplifier 11 is equal to or lower than the reference level given from the reference level supply unit 235, the power detecting unit 233 determines that the baseband signal does not exist, and stops sending the trigger signal to the signal demodulating unit 234.

When sending of the trigger signal is stopped, the clock control unit 231 controls the divider 15 to supply the clock signals CK1 and CK2.

Thus, in the receiving device of this embodiment, by operation of the clock signals CK1 and CK2, supply of the bias voltage corresponding to the threshold voltage of the semiconductor elements (rectifying transistors) of the rectifier 10 is continued, and the sensitive state of the rectifier is maintained. Then, by making the rectifier 10 be in the sensitive state, the receiving device 2 can be ready for arrival of a weak received signal.

Next, a remote control system according to still another embodiment will be described with reference to FIG. 7. The remote control system according to this embodiment is an application of the receiving device of the embodiment illustrated in FIG. 1 or FIG. 6 to a remote control device.

Figure 7:
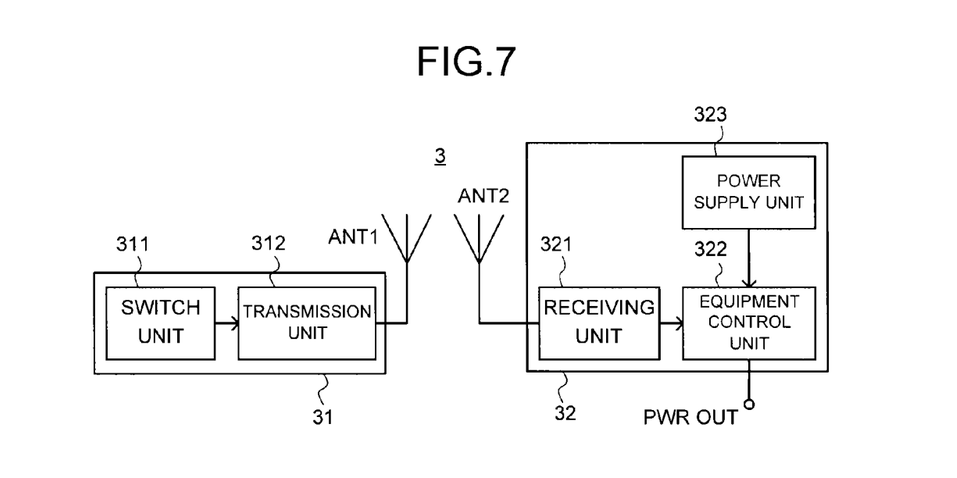
FIG. 7 is a block diagram illustrating an example of a remote control system applying the receiving device illustrated in FIG. 1 or FIG. 6.

As illustrated in FIG. 7, a remote control system 3 according to this embodiment includes a remote controller 31 having a switch unit 311 and a transmission unit 312 and a control device 32 having a receiving unit 321, an equipment control unit 322, and a power supply unit 323.

The switch unit 311 has a switch and a signal generating circuit, and operates as an interface accepting the user's instruction. The transmission unit 312 has a transmission circuit transmitting a radio wave in the 2.4 GHz band for example, and transmits a radio signal which is on-off keying modulated based on a signal from the switch unit 311.

The receiving unit 321 has a structure similar to the receiving device illustrated in FIG. 1 or FIG. 6 for example, and decodes the received signal into a digital signal end outputs the digital signal.

The equipment control unit 322 turns on or off the power supply from the power supply unit 323 based on the digital signal from the receiving unit 321. For example, the equipment control unit 322 turns on the power supply when the digital signal from the receiving unit 321 indicates control to turn on the power supply, or turns off the power supply when the digital signal similarly indicates control to turn off the power supply.

The power supply unit 323 is a power supply such as AC 100 V for example, and performs output to an output terminal PWROUT via the equipment control unit 322.

When the user operates the switch unit 311 to instruct to turn on the power supply, the switch unit 311 generates a signal indicating control to turn on the power supply and sends this signal to the transmission unit 312. The transmission unit 312 transmits the signal sent from the switch unit 311 as a radio signal via the antenna ANT1.

The received signal received via the ANT2 is sent to the receiving unit 321. The receiving unit 321 decodes the received signal and gives the obtained digital signal indicating control to turn on the power supply to the equipment control unit 322. When the digital signal is received from the receiving unit 321, the equipment control unit 322 turns on the power supply of the power supply unit 323.

This is similar when the user instructs to turn off the power supply. Based on the digital signal from the receiving unit 321, the equipment control unit 322 turns off the power supply from the power supply unit 323.

In the remote control system of this embodiment, since the power supply outputted from the output terminal PWROUT can be controlled by instructions from the remote controller 31, it is possible to minimize the standby power of an apparatus (not illustrated) connected to the output terminal PWROUT.

Further, when the distance between the remote controller and the control device is large, noise reduction of the receiving unit 321 is important in consideration of decoding quality of the received signal. In the remote control system of this embodiment, since the receiving device illustrated in FIG. 1 or FIG. 6 is applied as the receiving unit 321, increase in distance of remote control and reduction in power consumption can be achieved easily.

One aspect of the embodiments can provide a receiving device in which the influence of noise is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A receiving device, comprising:
   a rectifier configured to rectify a received signal;
   a bias supply circuit configured to intermittently supply the rectifier with a bias voltage corresponding to a threshold voltage of the rectifier;
   a detector configured to detect a presence of the received signal based on an output of the rectifier; and
   a controller configured to control the bias voltage of the bias supply circuit supplied to the rectifier to increase sensitivity of the rectifier in the absence of the received signal detected by the detector, the controller being configured to stop supply of the bias voltage to the rectifier to stop the increase in sensitivity of the rectifier as long as the detector detects the received signal.

2. The receiving device according to claim 1, wherein the detector comprises:
   a comparator configured to generate a digital signal based on the output of the rectifier; and
   a demodulator configured to decode the digital signal to determine presence of the received signal based on a decoding result.

3. A remote control system, comprising:
   a remote transmitter, having:
      an input unit configured to receive an instruction of a user, and
      a transmitter configured to transmit an instruction signal based on the instruction; and
   a remote controller, having:
      the receiving device according to claim 2 configured to receive the instruction signal as the received signal to decode the instruction signal transmitted by the transmitter; and
      an equipment controller configured to control power supply of an equipment based on the decoding result by the receiving device.

4. The receiving device according to claim 1, wherein:
   the rectifier comprises a switch configured to control supply of the bias voltage to the rectifier; and
   the bias supply circuit comprises a switch signal generator configured to generate a switch signal to control the switch, and
   the controller controls the switch signal generator to control generation of the switch signal upon the presence of the received signal detected by the detector.

5. The receiving device according to claim 4, wherein the switch signal generator generates a clock signal as the switch signal.

6. The receiving device according to claim 4, wherein the switch signal generator generates a clock signal as the switch signal, the clock signal having a clock cycle sufficiently longer than a time period needed for transmitting one packet of a packet signal included in the received signal.

7. The receiving device according to claim 1, wherein the rectifier comprises a semiconductor element.

* * * * *